US 6,696,753 B2

(12) United States Patent
Tokuhara

(10) Patent No.: US 6,696,753 B2
(45) Date of Patent: Feb. 24, 2004

(54) ENHANCEMENT OF WIRE BONDABILITY IN SEMICONDUCTOR DEVICE PACKAGE

(75) Inventor: Minoru Tokuhara, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/438,981

(22) Filed: May 16, 2003

(65) Prior Publication Data

US 2003/0214026 A1 Nov. 20, 2003

(30) Foreign Application Priority Data

May 17, 2002 (JP) ........................... 2002-142745

(51) Int. Cl.[7] ................. H01L 23/52; H01L 23/22
(52) U.S. Cl. ............... 257/692; 257/687; 257/666; 257/684
(58) Field of Search ................. 257/692, 666, 257/687, 786, 787, 684

(56) References Cited

U.S. PATENT DOCUMENTS

| 4,369,330 | A | * | 1/1983 | Pilz ........................... 174/52 S |
| 5,294,828 | A | * | 3/1994 | Okumura ..................... 257/676 |
| 5,455,386 | A | * | 10/1995 | Brathwaite et al. .......... 174/52.4 |
| 5,679,976 | A | * | 10/1997 | Nishikawa et al. .......... 257/690 |
| 5,880,522 | A | * | 3/1999 | Yonemoto et al. ........... 257/666 |
| 5,889,323 | A | * | 3/1999 | Tachibana ................... 257/704 |
| 5,943,558 | A | * | 8/1999 | Kim et al. ................... 438/125 |
| 5,977,623 | A | * | 11/1999 | Ahn ............................ 257/693 |
| 6,011,303 | A | * | 1/2000 | Tanaka et al. ............... 257/692 |
| 6,047,604 | A |   | 4/2000 | Auburger et al. |

FOREIGN PATENT DOCUMENTS

| JP | A-S56-98849 |   | 8/1981 |         |
| JP | 60-65551    | * | 4/1985 | ......... 29/827 |
| JP | A-S61-49450 |   | 3/1986 |         |
| JP | A-H6-125019 |   | 5/1994 |         |

* cited by examiner

Primary Examiner—Jasmine Clarke
(74) Attorney, Agent, or Firm—Posz & Bethards, PLC

(57) ABSTRACT

A semiconductor device package includes a semiconductor device, a resin casing, a plurality of leads, and a plurality of bonding wires. The semiconductor device includes a plurality of bonding pads. The resin casing has a device-mounting surface. The device-mounting surface has a recess. The semiconductor device has been mounted on the device-mounting surface. Each of the leads has a bonding surface. Each of the leads has been insert molded in the resin casing such that the bonding surface is exposed from the resin casing. Each of the bonding wires electrically connects each of the bonding pads and each of the bonding surfaces. Each of the bonding pads and the recess have a positional relation such that the semiconductor device is supported by the device-mounting surface right below the bonding pads when the bonding pads are wire bonded using the bonding wires.

14 Claims, 8 Drawing Sheets

ENHANCEMENT OF WIRE BONDABILITY IN SEMICONDUCTOR DEVICE PACKAGE

CROSS REFERENCE TO RELATED APPLICATION

This application is based on and incorporates herein by reference Japanese Patent Application No. 2002-142745 filed on May 17, 2002.

BACKGROUND OF THE INVENTION

The present invention relates to a semiconductor device package in which a device mounted on a resin casing is electrically connected to a lead insert molded in the resin casing using a bonding wire.

A proposed semiconductor device package of FIG. 8 is manufactured by: forming a resin casing 20 by injecting resin into a mold, in which a lead frame has already been placed; mounting a sensor device 10; and electrically connecting the sensor device 10 to each lead 40 of the lead frame at the bonding surface 41 thereof by wire bonding using bonding wires 50. For example, the sensor device 10 includes a diaphragm-type semiconductor pressure sensor chip 11 and a stage.12 as a single unit. The sensor chip 11 is bonded to the stage 12, and the sensor device 10 is fixed onto a device-mounting surface 21 of the resin casing 20 using, for example, an adhesive.

As shown in FIG. 9A, after a resin casing 20 is formed using a mold K1, the resin casing 20 is released from the mold K1 by pushing the resin casing 20 with a movable ejector pin P1 of the mold K1 along the direction shown with an arrow in the circular area AA. In this instance, as shown in FIG. 9B, flashes B1 are formed on a device-mounting surface 21 of the resin casing 20, at which the resin casing 20 is pushed by the movable ejector pin P1. The flashes B1 are unavoidable because the flashes B1 are formed by the resin seeping into the clearance between the ejector pin P1 and the mold K1, which is needed for allowing the ejector pin P1 to smoothly move.

There are demands that the resin casing 20 be as small as possible. Therefore, it is not possible to provide dedicatedly an area at which the resin casing 20 is pushed by the ejector pin separately from the device-mounting surface 21. For this reason, the resin casing 20 has been pushed by the ejector pin P1 at an area close to the lead frame or on the device-mounting surface 21 of the resin casing 20 when the resin casing 20 is released from the mold K1.

However, if an area near the lead frame is pushed by the ejector pin P1 for releasing the resin casing 20, the lead frame becomes tilted to worsen in flatness or lift off from the resin casing 20. As a result, the subsequent wire bonding process becomes adversely affected. On the other hand, if the device-mounting surface 21 is pushed by the ejector pin P1 for releasing the resin casing 20, flashes B1 are created on the device-mounting surface 21, and, as shown in FIG. 10, the sensor device 10 subsequently gets mounted over the flashes B1. As a result, the sensor device 10 becomes tilted when mounted, and wire bonding is no longer possible without removing the flashes B1. For this reason, an extra step is needed to remove the flashes B1 after the resin casing 20 is molded, despite the added work.

The inventors of the present invention have studied this issue and have prototyped a semiconductor device package of FIGS. 11A and 11B. In the device package of FIGS. 11A and 11B, a resin casing 20 has a recessed 21a in a device-mounting surface 21. When the resin casing 20 is released from a mold in its manufacturing process, the resin casing 20 gets pushed by an ejector pin at the bottom of the recess 21a. As a result, as shown in FIG. 11B, flashes B1 are confined in the recessed 21a, and the sensor device 10 of the device package of FIGS. 11A and 11B would not come in contact with the flashes B1. Consequently, the sensor device 10 would no longer tilt due to the flashes B1.

However, if a bonding pad 15 is located above the recessed 21a, another problem arises as described below. When the bonding pad 15 is wire bonded, a bonding tool presses a wire 50 to the pad 15 using ultrasonic vibration. Since the sensor device 10 is lifted above the resin casing 20 at the portion right above the recessed 21a, the sensor device 10 could tilt or shift during the wire bonding. As a result, the ultrasonic power to be used for the wire bonding may get dissipated, and the wires 50 may not be properly bonded. That is, preferable wire bondability may not be secured at the bonding pad 15.

Each bonding surface 41 of the leads 40 needs to be exposed from the resin casing 20 because the leads 40 are wire bonded at the bonding surfaces 41. However, if a mold resin seeps onto and attaches to the bonding surfaces 41 when the lead frame is insert molded, preferable wire bondability may not be secured at the bonding surface 41, either.

Thus, a semiconductor device package, in which a device mounted on a resin casing is,electrically connected to a lead insert molded in the resin casing with a bonding surface exposed using a bonding wire, has the above problems with wire bonding, if a bonding pad is located right above a recess as in the proposed semiconductor device package of FIGS. 11A and 11B or if a mold resin seeps onto and attaches to a bonding surface of a lead when a lead frame, from which the lead is formed, is insert molded.

SUMMARY OF THE INVENTION

The present invention has been made in view of the above aspects with an object to enhance the wire bondability in a semiconductor device package in which a device mounted on a resin casing is electrically connected to a lead insert molded in the resin casing using a bonding wire.

To achieve the object, a first semiconductor device, package according to the present invention includes a semiconductor device, a resin casing, a plurality of leads, and a plurality of bonding wires. The semiconductor device includes a plurality of bonding pads. The resin casing has a device-mounting surface. The device-mounting surface has a recess. The semiconductor device has been mounted on the device-mounting surface. Each of the leads has a bonding surface. Each of the leads has been insert molded in the resin casing such that the bonding surface is exposed from the resin casing. Each of the bonding wires electrically connects each of the bonding pads and each of the bonding surfaces. Each of the bonding pads and the recess have a positional relation such that the semiconductor device is supported by the device-mounting surface right below the bonding pads when the bonding pads are wire bonded using the bonding wires. Therefore, it is possible to prevent the semiconductor device from tilting or shifting when the bonding pads are wire bonded using the bonding wires.

To achieve the object, a second semiconductor device package according to the present invention includes a semiconductor device, a resin casing, a lead, and a bonding wire. The semiconductor device includes a bonding pad. The resin casing has a device-mounting surface. The semiconductor device has been mounted on the device-mounting surface. The lead has a bonding surface and a burr. The bonding wire electrically connects the bonding pad and the bonding surface. The burr is located at an edge of the bonding surface. The burr has functioned as a barrier to prevent a molten resin from seeping onto the bonding surface when the lead frame has been insert molded in the resin casing.

BRIEF DESCRIPTION OF THE DRAWINGS

The above and other objects, features and advantages of the present invention will become more apparent from the following detailed description, made with reference to the accompanying drawings. In the drawings.

DETAILED DESCRIPTION OF THE PREFERRED EMBODIMENTS

The present invention will be described in detail with reference to various embodiments.

Figure 1:
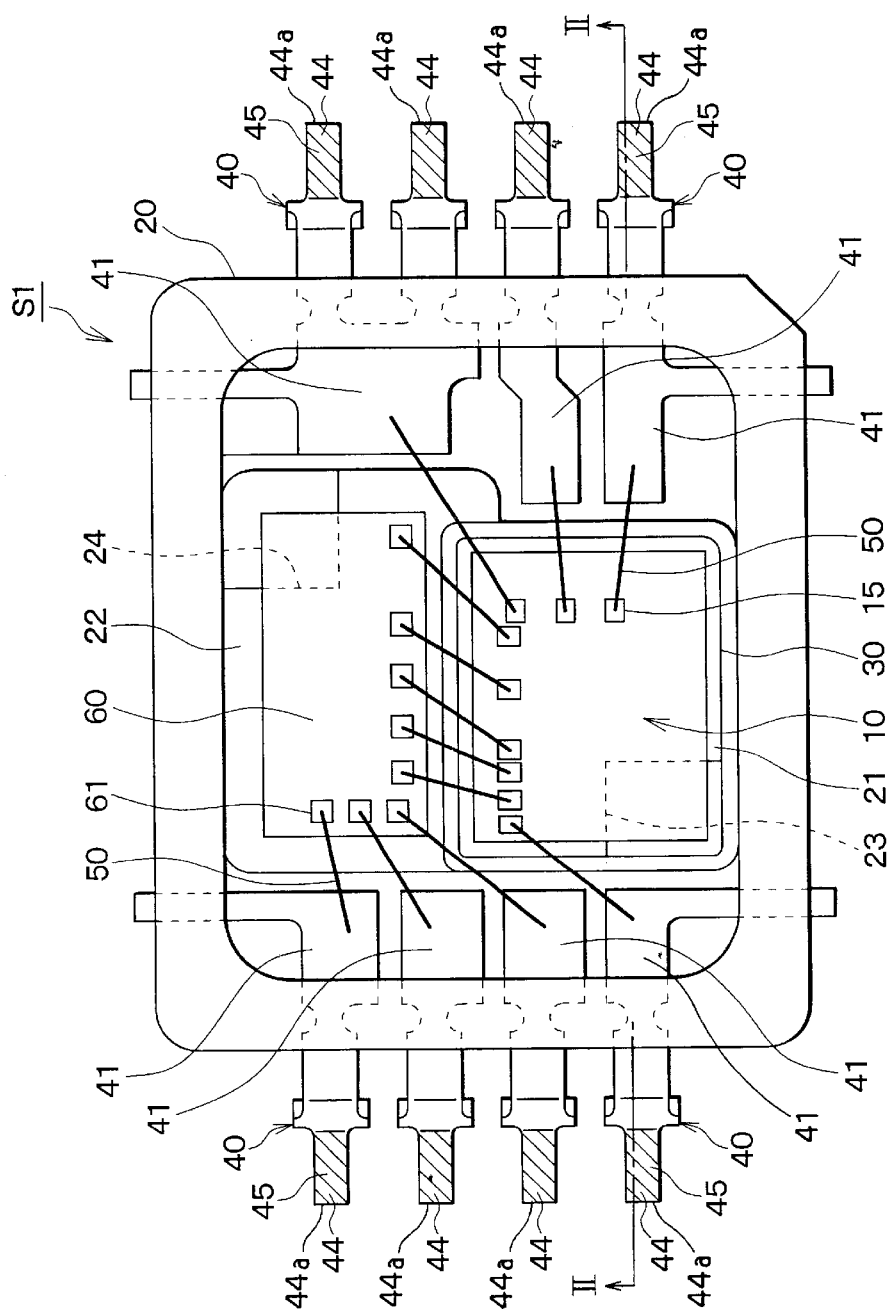
FIG. 1 is a schematic plan view of a pressure sensor package according to an embodiment of the present invention.
Figure 2:
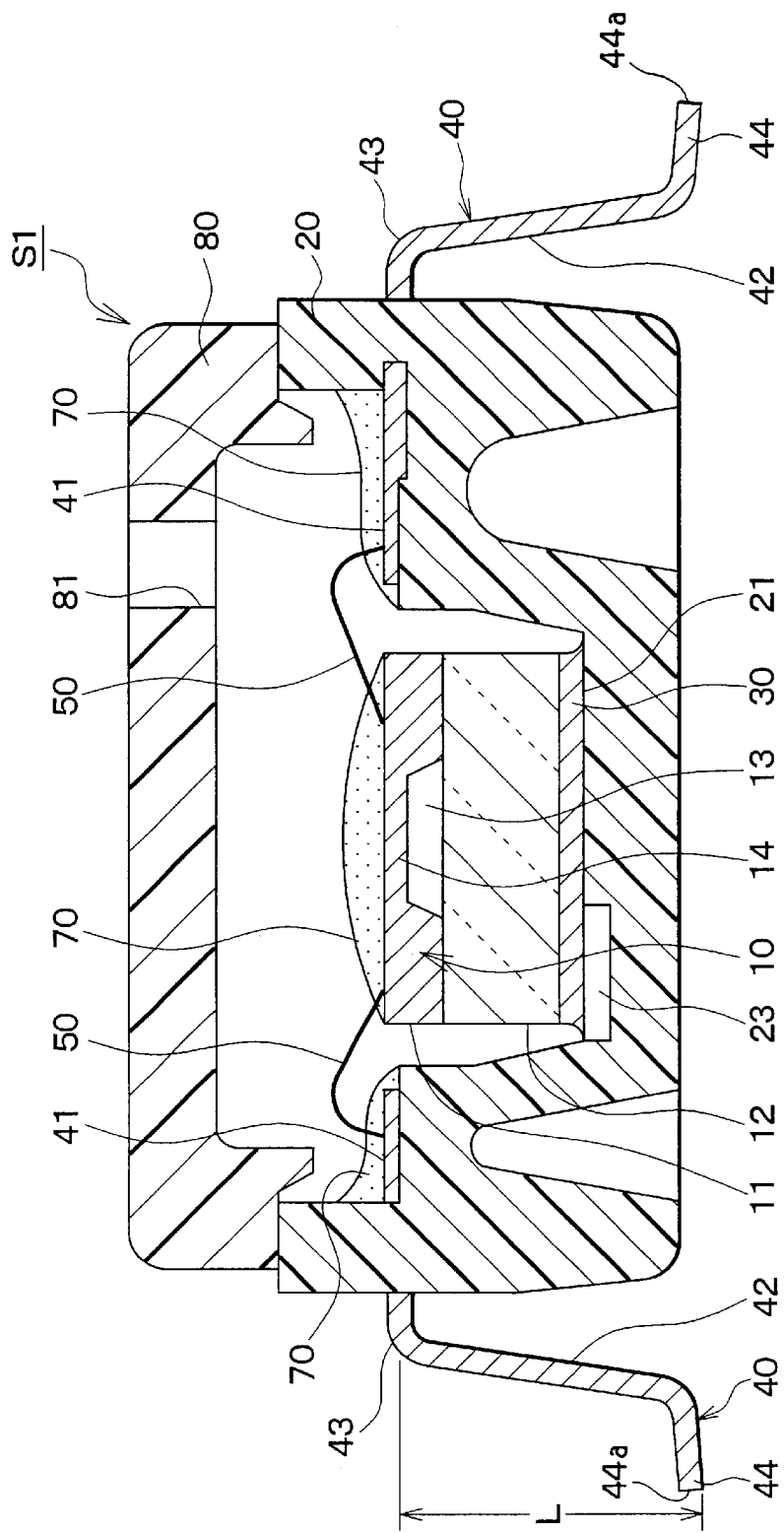
FIG. 2 is a schematic cross-sectional view of the pressure sensor package of FIG. 1 taken along the line II—II.

As shown in FIGS. 1 and 2, a pressure sensor package S1 according to an embodiment of the present invention includes a sensor device 10, which is a semiconductor device. The sensor device 10 includes a semiconductor chip 11, which is made from, for example, a silicon substrate, and has a recess, and a stage 12, which is made of, for example, a glass. The semiconductor chip 11 and the stage 12 are joined to form a pressure reference chamber 13 between them using the recess. The sensor device 10 is an absolute pressure detection device, which includes the internal reference chamber 13 to detect an absolute level of a pressure applied to the upper surface of the semiconductor chip 11 in FIG. 2.

As shown in FIG. 2, the semiconductor chip 11 includes a diaphragm 14, which is located at the bottom of the recess. Although not shown in the figure, gauge resistors are located on a surface of the diaphragm 14 to form a bridge circuit, which outputs an electric quantity in response to the pressure applied to the upper surface. The semiconductor chip 11 also includes an amplification circuit, although not shown in the figure. The amplification circuit is electrically connected to the bridge circuit. When the diaphragm 14 strains by the pressure applied to the upper surface of the diaphragm 14 in FIG. 2, an electric quantity such as potential in response to the strain, that is, in response to the pressure, is outputted from the bridge circuit to the amplification circuit. The electric quantity is amplified by the amplification circuit and outputted from the semiconductor chip 11.

As shown in FIG. 1, the pressure sensor package S1 also includes a resin casing 20. Although not shown in FIG. 1, the resin casing 20 has been covered by a lid 80. The resin casing 20 has a first device-mounting surface 21. The sensor device 10 has been mounted on the first device-mounting surface 21. The stage 12 of the sensor device 10 has been bonded and fixed on to the first device-mounting surface 21 with an adhesive 30, which includes, for example, a resin. The resin casing 20 has been formed by injection molding and is substantially made of a resin such as polyphenylene-sulfide (PPS).

The pressure sensor package S1 also includes a plurality of leads 40. As shown in FIG. 2, each of the lead 40 has a bonding surface 41 and an opposite surface 42, which is opposite to the bonding surface 41. The leads 40 have been formed by insert molding a lead frame in the resin casing 20. The lead frame has been formed by stamping a plate that is made of, for example, a copper alloy. The lead frame has been insert molded into the resin casing 20 such that the bonding surfaces 41 are exposed while the opposite surfaces 42 are in contact with the resin casing 20 right below the bonding surfaces 41.

As shown in FIG. 1, the semiconductor chip 11 also includes bonding pads 15 for wire bonding. The bonding surfaces 41 and the bonding pads 15 are electrically connected by bonding wires 50, which are made of, for example, gold or aluminum. Each of the leads 40 has a bent corner 43 in the portion that extends out of the resin casing 20, as shown in FIG. 2. Each of the leads 40 also has an end 44 that has a tip face 44a. The pressure sensor package S1 is joined to an external board such as a printed circuit board, which is not shown in the figure, at the ends 44 when the pressure sensor package S1 is mounted onto the external board. The ends 44 and the external board are electrically and mechanically connected using solder. Instead, of solder, a conductive adhesive may be used.

As shown in FIG. 1, each of the ends 44 has been entirely covered with a plating 45 such as flash gold plating in order to improve the wettability of solder when the pressure sensor package S1 of FIGS. 1 and 2 is soldered onto the external board. The flash gold plating meets the recent lead-free movement and offers superior wettability with many different types of solders. Furthermore, as shown in FIG. 1, the pressure sensor package S1 also includes a circuit chip 60, which is another semiconductor device. The circuit chip 60 has been mounted on a second device-mounting surface 22 next to the sensor device 10 in the resin casing 20. The circuit chip 60 has been bonded onto the second device-mounting surface 22 using, for example, an adhesive.

The circuit chip 60 includes bonding pads 61 for wire bonding. The bonding pads 61 are electrically connected to the bonding surfaces 41 and to bonding pads 15 of the sensor device 10 by bonding wires 50. In the pressure sensor package S1 of FIG. 1, the level of the first device-mounting surface 21, onto which the sensor device 10 has been bonded, and the level of the second device-mounting surface 22, onto which the circuit chip 60 has been bonded, have been adjusted such that the bonding pads 15 of the sensor device 10 and the bonding pads 61 of the circuit chip 60 are located substantially on the same level as the bonding surfaces 41 in order to facilitate the wire bonding between them.

The circuit chip 60 is used for adjusting the output signals transmitted in a form such as potential from the sensor chip 11. The output signals are transmitted through the wires 50 from the sensor chip 11 to the circuit chip 60 to be adjusted. Then, the output signals adjusted by the circuit chip 60 are transmitted back to the sensor chip 11 and outputted to an outside circuit through the wires 50 and the leads 40.

Main characteristics of the pressure sensor package S1 of FIGS. 1 and 2 will be described next. As shown in FIGS. 1 and 2, the first device-mounting surfaces 21 and the second device-mounting surface 22 respectively have a first recess 23 and a second recess 24. Furthermore, none of the bonding pads 15 of the sensor chip 11 is located right above the first recess 23, and none of the bonding pads 61 of the circuit chip 60 is located right above the second recess 24. In other words, the stage 12 is supported by the first device-mounting surfaces 21 at least right below each of the bonding pads 15 of the sensor chip 11, and the circuit chip 60 is supported by the second device-mounting surfaces 22 at least right below each of the bonding pads 61 of the circuit chip 60.

As shown in FIG. 1, in the pressure sensor package S1, the first recess 23 is substantially rectangular and overlaps with the sensor device 10 such that the first recess 23 can communicate with the ambient. The second recess 24 is also substantially rectangular and overlaps with the circuit chip 60 such that the second recess 24 can communicate with the ambient.

Figure 9A:
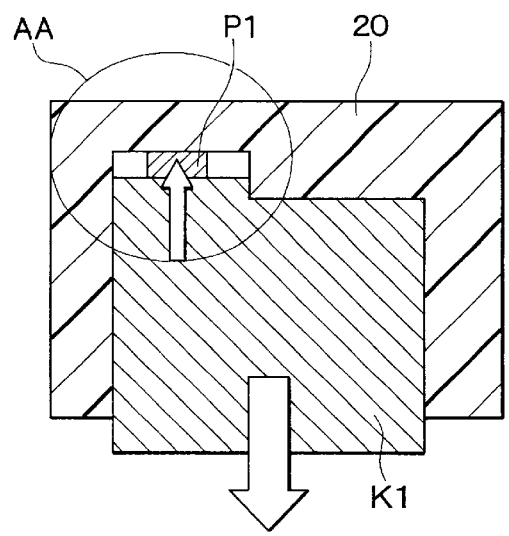
FIG. 9A is a schematic cross-sectional view showing a method for releasing a resin casing from a mold.
Figure 9B:
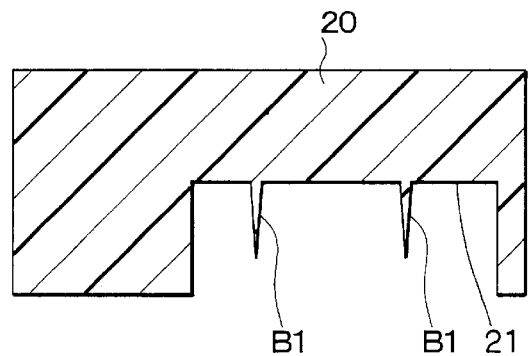
FIG. 9B is a schematic magnified view of the circular area AA in FIG. 9A.
Figure 10:
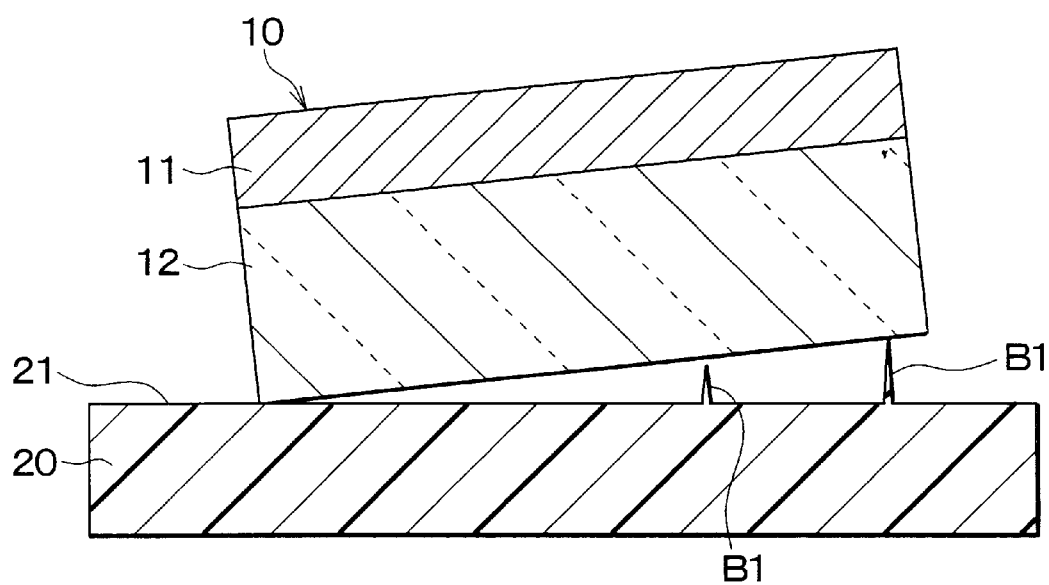
FIG. 10 is a schematic view showing how a sensor chip tilts due to flashes when mounted on a resin casing.

When the resin casing 20 is manufactured, the resin casing 20 is released from the mold using ejector pins in the same manner as shown in FIG. 9 after the resin casing 20 is formed in a mold. When the resin casing 20 is released from the mold, the ejector pins respectively press against the bottoms of the recesses 23, 24. Each depth of the recesses 23, 24 is greater than the height of the flashes created in the clearance between the ejector pin and the mold. Each depth of the recesses 23, 24 should be preferably, for example, 0.3 mm or greater.

As shown in FIG. 2, the upper surface of the semiconductor chip 11 of the sensor device 10 and each bonding surface 41 of the leads 40 are covered by a gel 70 to protect the contacts between the bonding wires 50 and the bonding pads 15 of the semiconductor chip 11 and the contacts between the bonding wires 50 and bonding surfaces 41. Although not shown in the figure, the upper surface of the circuit chip 60 is also covered by a gel 70 to protect the contacts between the bonding wires 50 and the bonding pads 61 of the circuit chip 60.

As shown in FIG. 2, the lid 80, which is made of a resin such as PPS, has been bonded onto the resin casing 20 using, for example, an adhesive. The sensor device 10, the circuit chip 60, and the bonding wires 50 are accommodated in a space formed by the resin casing 20 and the lid 80. The lid 80 has a pressure introduction hole 81, which permits the space to communicate with the outside, so the pressure to be measured is transmitted through the pressure introduction hole 81 into the space.

Therefore, the diaphragm 14 of the sensor device 10 strains due to the differential pressure between the pressure in the reference chamber 13 and the transmitted pressure to be measured. When the diaphragm 14 strains, an electric quantity such as potential in response to the strain, that is, in response to the pressure, is outputted from the semiconductor chip 11 to the circuit chip 60 through the bonding wires 50. The electric quantity is adjusted by the circuit chip 60 and transmitted back to the semiconductor chip 11 by the bonding wires 50. Then, the adjusted electric quantity is outputted to an outside circuit through the bonding wires 50 and the leads 40.

The pressure sensor package S1 of FIGS. 1 and 2 can be manufactured as follows. Firstly, a method for manufacturing a lead frame, from which the leads 40 of FIGS. 1 and 2 are formed, will be described. Each of the ends 44 of leads 40 can be entirely covered with a plating 45 with the method.

Figure 3:
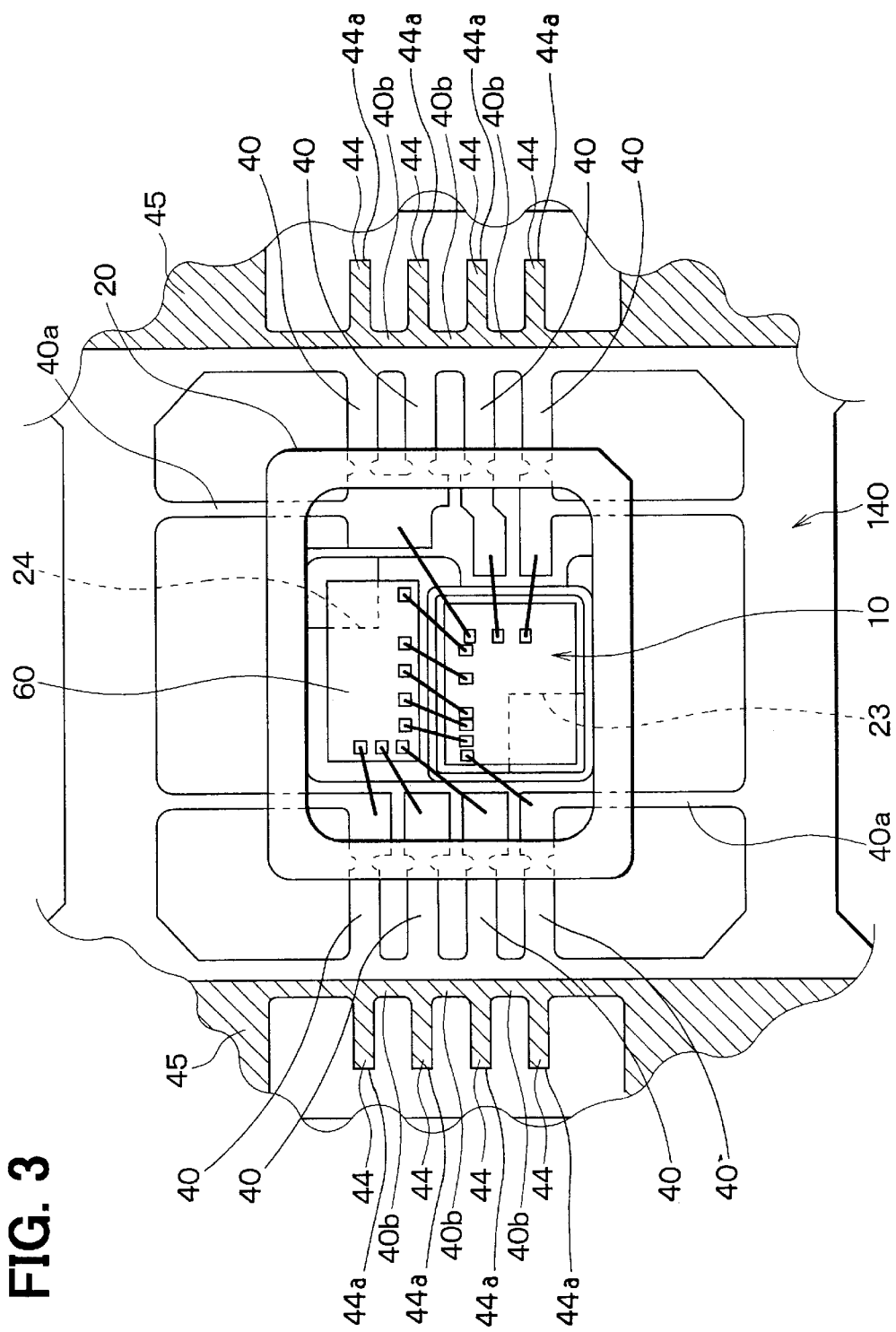
FIG. 3 is a schematic plan view of the pressure sensor package of FIG. 1 showing the state before the lead frame is machined.

In FIG. 3, leads 40 have been integrated with beams 40a and tie bars 40b to form a lead frame 140 before the lead frame 140 is machined to complete the pressure sensor package S1 of FIGS. 1 and 2. The lead frame 140 of FIG. 3 is formed by stamping a plate made of, for example, a copper alloy, and plating the entire surface thereof with nickel in order to secure proper wire bondability. When the plate is stamped, the ends 44 of the leads 40, each of which has the tip face 44a, are formed. Then, a plating 45 such a flash gold plating is formed using a stripe plating on the nickel plating at the ends 44, as shown in FIG. 3. Because the tip faces 44a are already exposed after the stamping, the tip faces 44a also get covered by the nickel plating and the flash gold plating 45.

Next, the lead frame 140 is set inside a mold having a cavity, the shape of which corresponds with the resin casing 20. A resin is injected into the mold to insert mold the lead frame 40. With the molding, the resin casing 20, in which the lead frame 40 has been insert molded and which has device-mounting surfaces 21, 22 and recesses 23, 24, is formed. Then, as mentioned earlier, the resin casing 20 is released from the mold by pushing the bottoms of the recesses 23, 24 with the ejector pins.

Then, the sensor device 10 and the circuit chip 60 are respectively bonded onto the device-mounting surfaces 21, 22 in the resin casing 20, and the bonding wires 50 are wire bonded. Then, the gel 70 is potted, and the lid 80 is attached. Finally, the lead frame 40 is machined, and the leads 40 are bent into shape to complete the pressure sensor package S1 of FIGS. 1 and 2.

Figure 4:
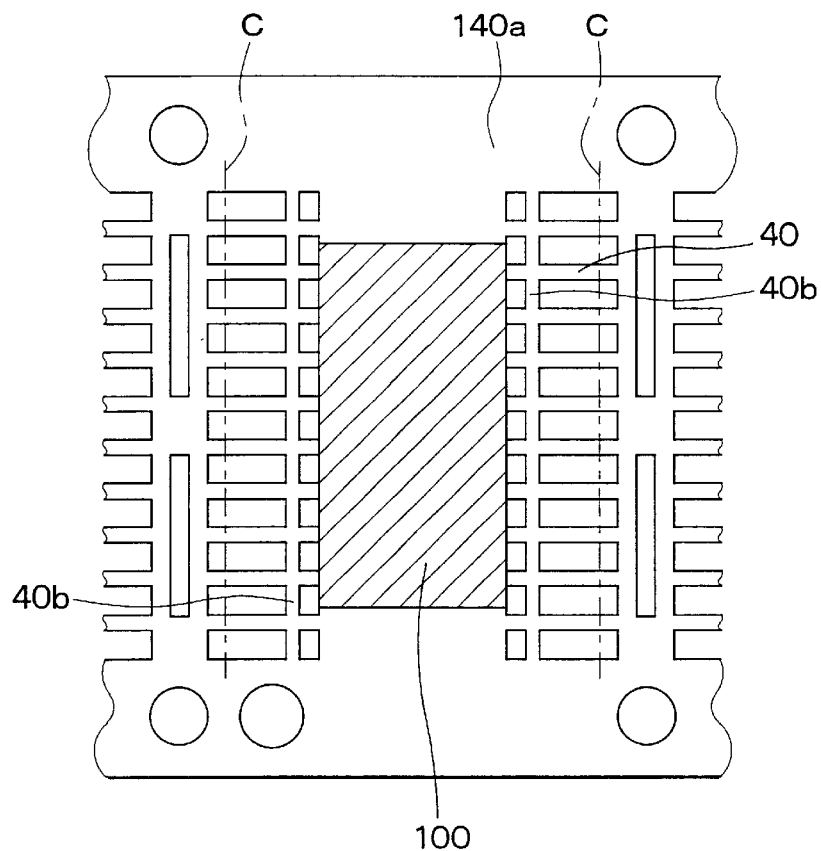
FIG. 4 is a schematic plan view showing a proposed lead frame.

As shown in FIG. 4, the tip faces of tip ends do not get plated in a proposed lead frame 140a, which includes a die bonding area 100, leads 40, and tie bars 40b, while the tip faces 44a of FIG. 3 are covered by the plating 45 for improving the wettability. As shown in FIG. 4, the proposed lead frame 140a is stamped out of a metal plate, and a flash gold plating is formed on the surface of the proposed lead frame 140a. Then, the periphery of the lead frame 140a and the tie bars 40b are cut off. At that time, the tip ends of the leads 40 are formed by cutting the leads 40 along the dotted lines C.

For this reason, while the upper and lower surfaces and the front and back surfaces of the lead 40 in FIG. 4 are plated, the tip faces of the lead 40, which emerge after the stamping, are not plated. As a result, the tip faces of the lead 40 have so poor wettability with a solder that there is a difficulty in the inspection for deciding whether the leads 40 and an external board are soldered together properly or not.

On the other hand, in the pressure sensor package S1 of FIGS. 1 and 2, the ends 44 of the leads 40 are entirely covered with the plating 45. Therefore, the tip faces 44a also have superior wettability. Thus, the solder fillets at the ends 44 can be readily inspected for deciding whether the leads 40 and an external board are soldered together properly or not.

As shown in FIG. 1, none of the bonding pads 15 of the sensor chip 11 is located right above the first recess 23, and none of the bonding pads 61 of the circuit chip 60 is located right above the second recess 24. In other words, each of the bonding pads 15 of the sensor chip 11 and the first recess 23 have a positional relation such that the stage 12 is supported by the first device-mounting surface 21 right below each of the bonding pads 15 of the sensor chip 11 when the bonding pads 15 of the sensor chip 11 are wire bonded. In addition, each of the bonding pads 61 of the circuit chip 60 and the second recess 24 have a positional relation such that the circuit chip 60 is supported by the second device-mounting surface 22 right below each of the bonding pads 61 of the circuit chip 60 when the bonding pads 61 of the circuit chip 60 are wire bonded.

Figure 11A:
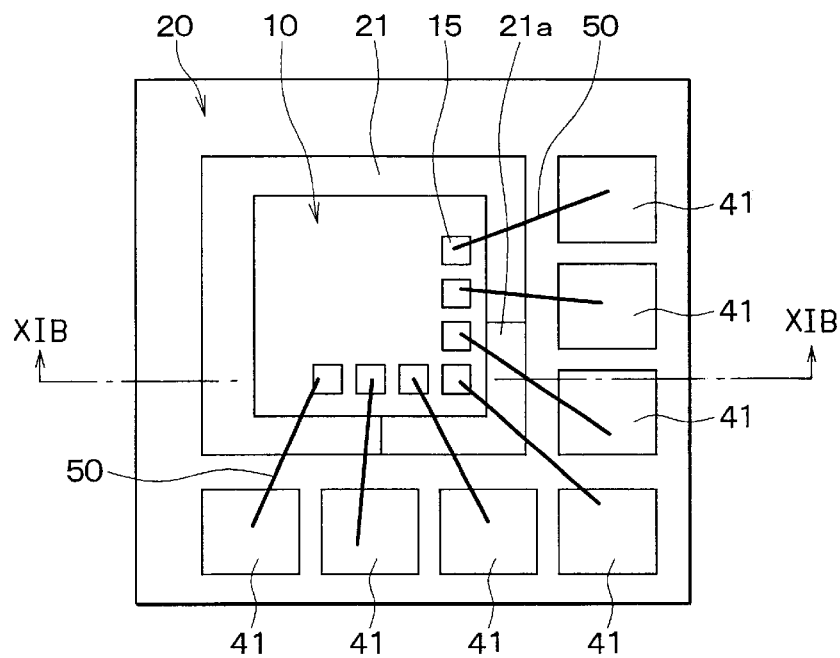
FIG. 11A is a schematic plan view of another proposed semiconductor device package.
Figure 11B:
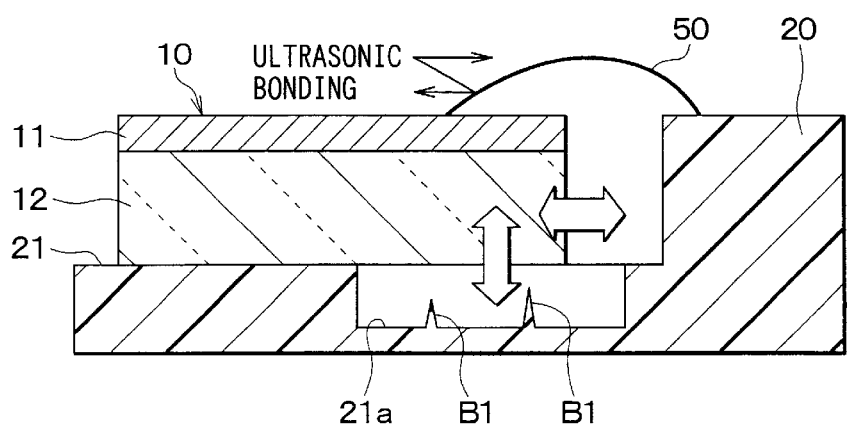
FIG. 11B is a cross-sectional view of the device package of FIG. 11A taken along the line XIB—XIB.

For this reason, the sensor device 10 and the circuit chip 60 are prevented from tilting or shifting during the wire bonding. As a result, the ultrasonic power to be used for the wire bonding would not get dissipated in the manufacturing process of the pressure sensor package S1 of FIGS. 1 and 2, and the wire bonding is accomplished more readily in comparison with the semiconductor device package of FIGS. 11A and 11B. In other words, it is possible to secure proper wire bondability in the pressure sensor package S1 of FIGS. 1 and 2, even though the recesses 23, 24 are formed in the device-mounting surfaces 21, 22.

Furthermore, in the manufacturing process of the pressure sensor package S1 of FIGS. 1 and 2, when the resin casing 20 is released from the mold, the ejector pins respectively press against the bottoms of the recesses 23, 24, and each depth of the recesses 23, 24 is greater than the height of the flashes created in the clearance between the ejector pin and the mold. As a result, the flashes can be confined in the recesses 23, 24. For this reason, the flashes would not cause the sensor device 10 and the circuit chip 60 to tilt when the sensor device 10 and the circuit chip 60 are bonded to the first and second device-mounting surfaces 21, 22, respectively.

Furthermore, as shown in FIG. 1, the first recess 23 overlaps with the sensor device 10 such that the first recess 23 can communicate with the ambient, and the second recess 24 overlaps with the circuit chip 60 such that such that the second recess 24 can communicate with the ambient in the pressure sensor package S1. If the sensor device 10 and the circuit chip 60 would completely seal the recesses 23, 24, the confined air in the recesses 23, 24 may expand under heat and may cause the sensor device 10 and the circuit chip 60 to lift off from the corresponding device-mounting surfaces 21, 22. However, in the pressure sensor package S1 of FIGS. 1 and 2, the recesses 23, 24 can communicate with the ambient, so the air would not be confined inside the recesses 23, 24.

Figure 5:
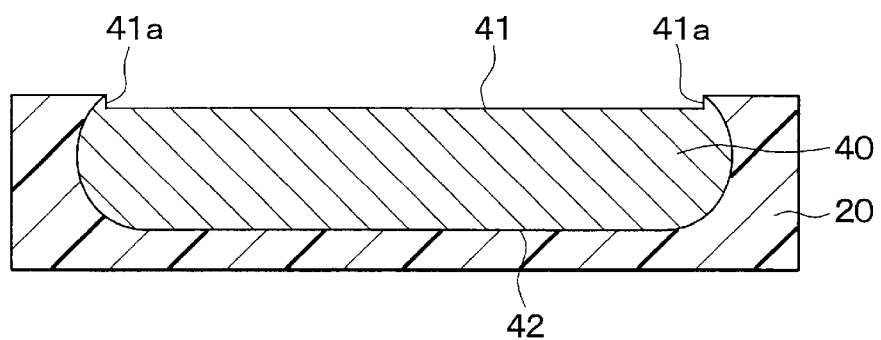
FIG. 5 is a schematic partial cross-sectional view of the pressure sensor package of FIG. 1, showing the state after a lead is insert molded in a resin casing such that the surface of the lead that has faced an immovable metal die of a stamping tool when a lead frame is stamped out is exposed from the resin casing.

In the manufacturing process of the pressure sensor package S1 of FIGS. 1 and 2, the lead frame 140 is stamped out from a metal plate using a stamping tool equipped with an immovable metal die and a movable metal punch. Then, the lead frame 140 is insert molded in the resin casing 20 such that the surface of the lead frame 140 that has faced the immovable die when the lead frame 40 is stamped out is exposed from the resin casing 20 as the bonding surfaces 41, as shown in FIG. 5.

When the lead frame 40 is stamped, burrs 41a are formed in the lead frame 40 at the edges of the surfaces that face the immovable metal die. The surfaces that face the immovable metal die become the bonding surfaces 41, as shown in FIG. 5. On the other hand, the edges of the surfaces that have faced the movable metal punch are round, as shown in FIG. 5. The surfaces that have faced the movable metal punch become the opposite surfaces 42, which are opposite to the bonding surfaces 41.

Figure 6A:
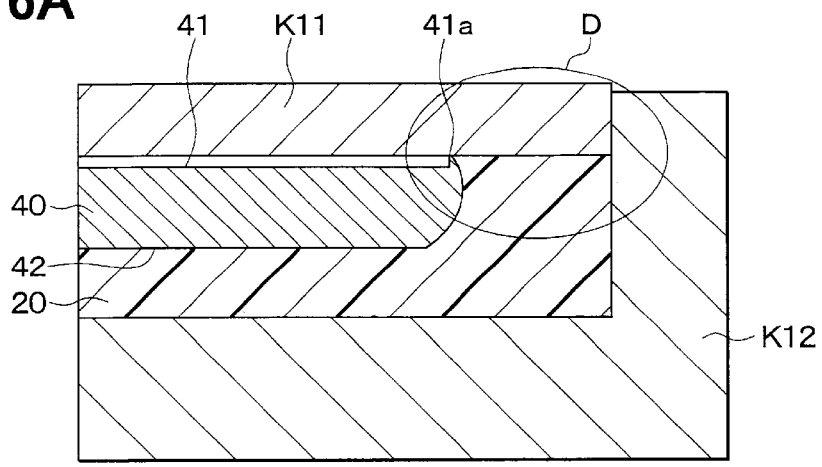
FIG. 6A is a schematic cross-sectional view showing an insert molding for forming the structure shown in FIG. 5.
Figure 6B:
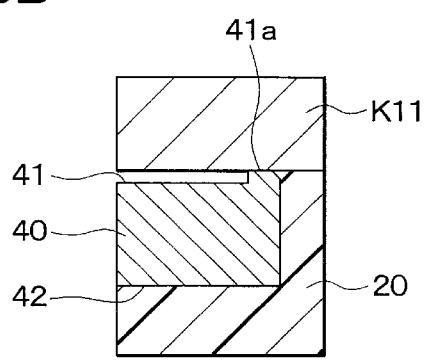
FIG. 6B is a schematic magnified view of the circular area D in FIG. 6A.
Figure 7:
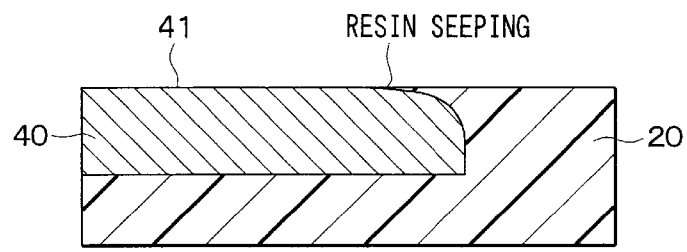
FIG. 7 is a schematic partial cross-sectional view of a package, in which a lead frame has been insert molded in a resin casing such that the surface of the lead frame that has faced a movable metal punch of a stamping tool when the lead frame is stamped out is exposed from the resin casing.
Figure 8:
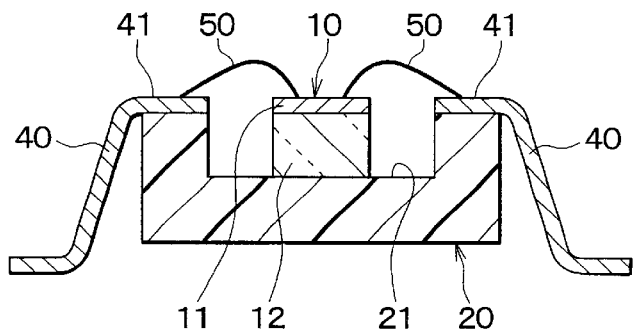
FIG. 8 is a schematic cross sectional view of a proposed semiconductor device package.

As shown in FIG. 6A, the resin casing 20 is formed by: placing a lead frame 140 in a lower mold K12; fitting an upper mold K11 into the lower mold K12; and filling the cavity formed by the molds K12, K11 with a molten resin. At that time, as shown in FIG. 6B, the burrs 41a are crushed by the upper mold K11, and the crushed burrs 41a contact hard the upper mold K11. As a result, the crushed burrs 41a function as barriers at the edges of the bonding surfaces 41 of the lead frame 40 to prevent the molten resin from seeping onto the bonding surfaces 41. On the contrary, if the surfaces of the lead frame 140 that face the movable metal punch were used as the bonding surfaces 41, the molten resin would stick onto the bonding surfaces 41 as shown in FIG. 7, because the molten resin could seep along the round edges of the bonding surfaces 41. Therefore, with the preferred structure shown in FIG. 5, the quality in wire bonding can be enhanced in the pressure sensor package S1 of FIGS. 1 and 2.

In addition to that, the pressure sensor package S1 of FIGS. 1 and 2 has another advantage at the contacts between the leads 40 and the external board, to which the leads 40 are soldered. If the surfaces of a lead frame that have faced a movable metal punch were used as bonding surfaces, the flashes of the leads made from the lead frame would come into contact with an external board and cause the pressure sensor package including those leads to tilt when the pressure sensor package is mounted onto the external board to solder the leads to the external board. In contrast, such a problem would not be encountered with the pressure sensor package S1 of FIGS. 1 and 2, and a stable mounting can be achieved.

In addition to that, the pressure sensor package S1 of FIGS. 1 and 2 has another advantage in its leads 40. As shown in FIG. 1, each of the leads 40 has a neck at the portion that is buried in the resin casing 20. With the neck, each of the leads 40 is firmly joined to the resin casing 20 to withstand a force applied to the leads 40 in a direction parallel to the lead frame 140 when the lead frame 140 is machined.

In addition to that, the pressure sensor package S1 of FIGS. 1 and 2 has one more advantage in its leads 40. As shown in FIG. 1, the distance L from the surface of the external board, which is not illustrated, to the bent corners 43 is 2 mm or greater in the pressure,sensor package S1. If the distance L were approximately 1 mm, the solder would creep up along the opposite surfaces 42, which are opposite to the bonding surfaces 41, and stick to the bent corners 43. The bent corners 43 are designed to relieve stress in the leads 40. The bent corners 43 would not be able to adequately relieve the stress if covered and hardened by the solder.

Studies conducted by the inventors of the present invention have shown that if the distance L is greater 2 mm or greater, the solder would not creep up to the bent corners 43. Therefore, the bent corners 43 are capable of adequately relieving the stress in the pressure sensor package S1 of FIGS. 1 and 2.

Other Embodiments

In the pressure sensor package S1 of FIGS. 1 and 2, the first device-mounting surfaces 21 and the second device-mounting surface 22 respectively have the first recess 23 and the second recess 24 to confine the flashes in the recesses 23, 24. Instead, the flashes may be removed after the resin casing 20 is molded without forming the recesses 23, 24. Even in such an instance, proper wire bondability is secured because the resin would not attach onto the bonding surfaces 41 with the structure shown in FIG. 5.

Furthermore, the present invention is not limited to the pressure sensor package S1 of FIGS. 1 and 2 and can be applied to any semiconductor device package in which a device mounted on a resin casing is electrically connected to a lead insert molded in the resin casing using a bonding wire. For example, the present invention can be applied to an infrared sensor package, a gas sensor package, a flow sensor package, or a moisture sensor package.

What is claimed is:

1. A semiconductor device package comprising:
    a semiconductor device, which includes a plurality of bonding pads;
    a resin casing, which has a device-mounting surface, wherein the device-mounting surface has a recess, and wherein the semiconductor device has been mounted on the device-mounting surface;
    a plurality of leads, each of which has a bonding surface, wherein each of the leads has been insert molded in the resin casing such that the bonding surface is exposed from the resin casing; and
    a plurality of bonding wires, each of which electrically connects each of the bonding pads and each of the bonding surfaces, wherein each of the bonding pads and the recess have a positional relation such that the semiconductor device is supported by the device-mounting surface right below the bonding pads when the bonding pads are wire bonded using the bonding wires.

2. The semiconductor device package according to claim 1, wherein a flash, which has been formed when the resin casing is pushed by an ejector pin in order to release the resin casing from a mold after the resin casing is formed by insert molding, is located on a bottom of the recess.

3. The semiconductor device package according to claim 2, wherein a depth of the recess is 0.3 mm or greater.

4. The semiconductor device package according to claim 1, wherein the semiconductor device overlaps with the recess such that the recess can communicate with the ambient.

5. The semiconductor device package according to claim 1, wherein the semiconductor device is a sensor device.

6. The semiconductor device package according to claim 1, wherein each of the leads has a plated tip face in order to improve wettability of solder.

7. The semiconductor device package according to claim 1, wherein the lead has a neck at a portion that is buried in the resin casing in order to join the lead to the resin casing firmly enough to withstand a force applied to the lead.

8. The semiconductor device package according to claim 1, wherein the lead has a bent corner and an end, at which the lead becomes into contact with an external board when the device package is soldered to the external board, and wherein the length between the bent corner and the end is long enough to permit a distance from a surface of the external board to the bent corners to be 2 mm or greater in order to prevent a solder from creeping up from the surface and sticking to the bent corner when the device package is soldered to the external board.

9. A semiconductor device package comprising:
    a semiconductor device, which includes a bonding pad;
    a resin casing, which has a device-mounting surface, wherein the semiconductor device has been mounted on the device-mounting surface;
    a lead, which has a bonding surface and a burr; and
    a bonding wire, which electrically connects the bonding pad and the bonding surface, wherein the burr is located at an edge of the bonding surface, and wherein the burr has functioned as a barrier to prevent a molten resin from seeping onto the bonding surface when the lead frame has been insert molded in the resin casing.

10. The semiconductor device package according to claim 9, wherein the semiconductor device is a sensor device.

11. The semiconductor device package according to claim 9, wherein the lead has a plated tip face in order to improve wettability of solder.

12. The semiconductor device package according to claim 9, wherein the lead has an opposite surface, which is opposite to the bonding surface, wherein the lead becomes into contact with an external board at the opposite surface to prevent the device package from tilting due to the burr when the device package is soldered to the external board.

13. The semiconductor device package according to claim 9, wherein the lead has a neck at a portion that is buried in the resin casing in order to join the lead to the resin casing firmly enough to withstand a force applied to the lead.

14. The semiconductor device package according to claim 9, wherein the lead has a bent corner and an end, at which the lead becomes into contact with an external board when the device package is soldered to the external board, and wherein the length between the bent corner and the end is long enough to permit a distance from a surface of the external board to the bent corners to be 2 mm or greater in order to prevent a solder from creeping up from the surface and sticking to the bent corner when the device package is soldered to the external board.

* * * * *